United States Patent [19]
Meyer

[11] Patent Number: 6,104,287
[45] Date of Patent: Aug. 15, 2000

[54] CIRCULATOR REVERSE POWER ALARM

[75] Inventor: Charles John Meyer, Wayne, N.J.

[73] Assignee: Lucent Technologies Inc., Murray Hill, N.J.

[21] Appl. No.: 08/884,229

[22] Filed: Jun. 27, 1997

[51] Int. Cl.$^7$ .............................. G08B 1/08; G01R 31/08
[52] U.S. Cl. ..................... 340/539; 340/531; 340/514; 324/512; 324/533; 333/17.3
[58] Field of Search ..................... 340/539, 531, 340/514, 561; 324/533, 512, 529, 530; 333/17.1, 17.3

[56] References Cited

U.S. PATENT DOCUMENTS

| | | | |
|---|---|---|---|
| 3,588,611 | 6/1971 | Lambden | 324/52 |
| 3,601,717 | 8/1971 | Kuecken | 455/125 |
| 3,753,086 | 8/1973 | Shoemaker, Jr. | 324/533 |
| 3,919,644 | 11/1975 | Smolka | 455/123 |
| 4,023,154 | 5/1977 | Comeaux | 324/533 |
| 4,630,228 | 12/1986 | Tarczy-Hornoch et al. | 324/52 |
| 4,743,887 | 5/1988 | Pothier | 340/531 |
| 5,068,614 | 11/1991 | Fields et al. | 324/534 |
| 5,083,086 | 1/1992 | Steiner | 324/533 |
| 5,352,984 | 10/1994 | Piesinger | 324/532 |
| 5,517,198 | 5/1996 | McEwan | 342/89 |

*Primary Examiner*—Donnie L. Crosland

[57] ABSTRACT

An apparatus for detecting a damaged, disconnected or disabled RF load in an RF communications system wherein an RF source sends forward RF signals to the RF load. In general, the apparatus consists of an alarm circuit, and a device which passes RF signals reflected from the RF load to the alarm circuit. In one illustrative embodiment, the device is a circulator electrically connected to the RF source, the RF load and the alarm circuit such that, when there is an impedance mismatch between the RF source and the RF load, a portion of the forward RF signal reflects back through the circulator to the alarm circuit. The alarm circuit then checks whether the reflected portion of the forward RF signal (i.e. the reflected signal) meets a particular criterion indicating that a substantial impedance mismatch exists between the RF load and the RF source, thus indicating that the RF load is damaged disconnected or disabled. If the alarm circuit determines that the particular criterion indicating the RF load is damaged, disabled or disconnected, the alarm circuit triggers an alarm.

17 Claims, 1 Drawing Sheet

CIRCULATOR REVERSE POWER ALARM

FIELD OF THE INVENTION

The present invention relates to apparatus for detecting RF signals reflected by an electrical load to which RF signals are transmitted, and more particularly to an apparatus for detecting RF signals reflected by a damaged or disconnected load.

BACKGROUND OF THE INVENTION

The efficiency of power transfer between an RF source and an RF load is maximized when the output impedance of the source matches the input impedance of the load. That is, when the source impedance and the load impedance are exactly matched, the load absorbs 100% of the signal transmitted by the source (i.e. the forward signal). When the load impedance varies from the source impedance, however, the load does not absorb the entire forward signal. Rather, the load "reflects" a portion of the forward signal back to the source. The reflected portion of the forward signal is referred to as the reflected signal.

Impedance is defined as having a real component and an imaginary component. The real component is related to electrical resistance, and the imaginary component is related to electrical capacitance and/or electrical inductance. Thus, depending on the existence and size of these components (i.e. resistance, capacitance and/or inductance), source impedance and/or load impedance may consist of some combination of the real component and the imaginary component.

Regardless of its components, the impedance of a source and/or a load may vary over time for variety of reasons. For example, the impedance of a load may drift due to a change in the electrical resistance, capacitance and/or impedance of the components which the load is composed. Such drift may be due to temperature changes, dust, mold, and other environmental forces. Moreover, the impedance of a load may change as a result of the load circuitry becoming damaged, disabled or disconnected due to such environmental factors.

For example, in an RF communication system having an RF output circuit (i.e. source) connected to an antenna (i.e. load), the RF output circuit outputs RF signals (i.e. forward signals) to the antenna for transmission over the air. If, however, the impedance of the RF output circuit is not properly matched to the impedance of the antenna input, then a portion of the forward RF signal will reflect back from the antenna to the RF output circuit (i.e. reflected signal). In fact, the greater the mismatch between the RF output circuit and the antenna input, the greater the value of magnitude of the reflected signal. Thus, the value or magnitude of the reflected signal contains information concerning the extent of the mismatch between the source and the load impedance.

Presently, there are instruments, or systems, available that detect the impedance mismatch between a source and a load (i.e. an RF output circuit and an antenna), and adjust the impedance of either the source or the load to reduce the detected mismatch. Such instruments have been employed to assist in matching source and load impedance to optimize long range transmissions of RE signals between RF transmitters and receivers.

One such instrument is disclosed by Smolka in U.S. Pat. No. 3,919,644, issued Nov. 11, 1975, and incorporated herein by reference. Basically, Smolka discloses an automatic antenna coupler operable to measure the real part of an antenna impedance (i.e. load impedance), and adjust the antenna impedance until it matched a source impedance. To do this, Smolka requires that impedance and phase sensors, and a matching circuit be incorporated into the RF communications system containing the antenna and the source. The impedance and phase sensors detect the impedance mismatch between the source and the load, and the matching circuit is used to vary the impedance of the load to reduce the detected impedance mismatch. As a result, the Smolka device requires the addition of a significant number of components to the RF communications system, thus adding significant cost thereto.

Another instrument for detecting and controlling impedance mismatch between an RE source and an RF load is disclosed by Kuecken in U.S. Pat. No. 3,601,717, issued Aug. 21, 1971, and incorporated herein by reference. Kuecken discloses an automatic impedance matching system including an arrangement for adjusting a matching network coupled between the RF source output and the RF load input to achieve the desired impedance matching between the RF source and the RF load. Significantly, the adjustments to the matching circuit are based on a detected relationship between the forward signal and the reflected signal. That is, Kuecken teaches a device operable to identify a relationship between the forward signal and the reflected signal, and to adjust the matching network based on the identified relationship. Thus, to achieve a source-load impedance match, Kuecken requires that the RF communication system containing the RF source and load incorporate numerous and/or costly components including phase sensors, impedance sensors and a matching network. Thus, the Kuecken device adds significant cost to the RF communications system.

Consequently, even though present day devices can be used to detect a mismatch between an RF source and an RF load, such devices add considerable cost to the overall system. Moreover, such devices are not desirable for some present day applications. For example, in an RF communications system wherein it is desired to only monitor the impedance match between an RF source and an antenna to identify whether the antenna is damaged, disconnected, or disabled, the above described devices are not practical. This is due to the fact that they include expensive components designed to provide more extensive functionality than may be needed in the RF communications system just described.

SUMMARY OF THE INVENTION

The present invention provides a low cost apparatus for identifying a damaged or disconnected RF load in an RF communications system by monitoring whether a portion of a forward RF signal sent from an RF source to an RF load reflects back toward the RF source. In general, the apparatus consists of an alarm circuit that determines when the reflected RF energy indicates that the RF load is damaged, disabled or disconnected, and a device for passing reflected RF energy to the alarm circuit. If the alarm circuit determines that the reflected signal meets a particular criterion (e.g. is greater than a given portion of the forward RF signal), the alarm circuit triggers an alarm indicating that the antenna impedance is significantly mismatched from the impedance of the RF transmitter, thus indicating that the RF load is damaged, disabled or disconnected.

DETAILED DESCRIPTION OF ILLUSTRATIVE EMBODIMENTS OF THE INVENTION

Figure 1:
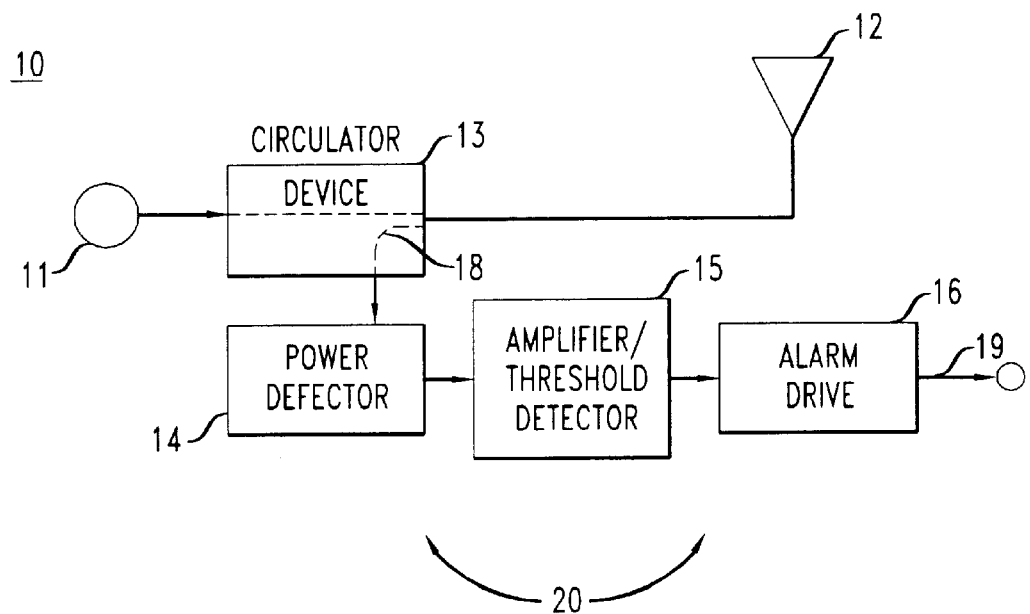
FIG. 1 is block diagram of an illustrative embodiment of an apparatus according to the present invention.

Referring now to FIG. 1 there is shown a block diagram of an illustrative embodiment of an apparatus for detecting a significant impedance mismatch indicating a damaged, disconnected or disabled RF load in an RF communications system, according to the present invention, hereinafter referred to as apparatus 10. As shown, apparatus 10 has a circulator 13 electrically coupled to an RF source 11, an antenna 12 and an alarm circuit 20. Alarm circuit 20 has a power detector 14 electrically coupled to circulator 13 and amplifier/threshold detector 15 which is connected to alarm drive 16. Alarm drive 16 has an alarm output 19.

In operation, forward RF signals sent from RF source 11 to antenna 12 pass through circulator 13 along path 17. If antenna 12 is not perfectly impedance-matched with RF source 11, a portion of the forward RF signal is reflected back through circulator 13 along path 18 to power detector 14 of alarm circuit 20. This reflected portion of the forward RF signal is referred to as the reflected signal. Once the reflected signal is passed through circulator 13 to power detector 14, alarm circuit 20 determines whether the reflected signal meets a given criterion indicating that antenna 12 is damaged, disconnected or disabled. That is, alarm circuit 20 determines whether the reflected signal is greater than a given amount which indicates that the impedance mismatch between RF source 11 and antenna 12 is large enough that antenna 12 may be damaged, disabled and/or disconnected from RF source 11. If alarm circuit 20 determines that the reflected signal is greater than the given amount, then a signal is sent to amplifier 15 which amplifies the signal and sends the amplified signal to alarm drive 16. Alarm drive 16 then sends an alarm signal through output 19 to activate an alarm (not shown). As a result, the alarm indicates that the impedance mismatch between the RF source and the RF load (i.e. the antenna) is so great that the RF load may be damaged, disconnected or disabled.

Apparatus 10 is just an illustrative example of one apparatus for detecting the condition of a damaged or disconnected RF load (e.g. antenna) in an RF communications system. The basic circuit or apparatus consisting of an alarm circuit for determining whether the reflected RF signal indicates the RF load is damaged, disabled or disconnected from the RF source, and a device for passing the reflected RF signal to the alarm circuit, can be configured as desired by those skilled in the art to provide the detection of any type of damaged, disabled or disconnected RF load, including an antenna.

That is, the alarm circuit may include any arrangement for detecting reflected RF energy from an RF load, and triggering an alarm when the reflected RF energy meets a criterion indicating that the RP load is damaged, disabled and/or disconnected from the RF source. Similarly, the device described herein may be any device that is operable to pass the reflected RF signal to the alarm circuit. For example, in one embodiment, the alarm circuit described herein may be composed of an RF signal detector and a circuit for triggering an alarm when the RF signal detector detects a signal having a magnitude greater than a given amount. In such an embodiment, the device for passing the reflected RF signals to the alarm circuit may be a circulator or a coupler. Thus, the present invention is not limited to a circulator or coupler, or the specific alarm circuit embodiments described herein.

Thus, while the invention has been particularly shown and described with reference to various embodiments, it will be recognized by those skilled in the art that modifications and changes may be made to the present invention without departing from the spirit and scope thereof. As a result, the invention in its broader aspects is not limited to specific details shown and described herein. Various modifications may be made without departing from the spirit or scope of the general inventive concept as defined by the appended claims and their equivalents.

What is claimed is:

1. An apparatus, for use in a communications system wherein an RF source sends forward RF signals to an RF load, the apparatus comprising:

an alarm circuit for triggering an alarm when forward RF signals reflected from the RF load meet a particular criterion; and a device for passing said reflected RF signals from the RF load to said alarm circuit, wherein said RF source is an RF transmitter, and wherein said RF load is an antenna which transmits the forward RF signals over the air.

2. The apparatus of claim 1 wherein said RF transmitter has an output circuit, wherein said antenna has an input terminal, and wherein said device has three terminals, one device terminal being connected to said output of said RF source, another device terminal being connected to said input terminal of said antenna, and another device terminal being connected to said input terminal of said alarm circuit.

3. The apparatus of claim 2 wherein said alarm circuit comprises a power detector electrically coupled to said device terminal connected to said input terminal of said alarm circuit; an amplifier electrically coupled to said power detector; and an alarm drive circuit electrically coupled to said amplifier.

4. The apparatus of claim 3 wherein said device is a circulator.

5. The apparatus of claim 3 wherein said device is a coupler.

6. The apparatus of claim 1 wherein said particular criterion is met when said reflected RF signals passed to said alarm circuit have a magnitude greater than a predetermined value.

7. An apparatus comprising:

a device having a first terminal, a second terminal, and a third terminal;

an RF load electrically coupled to said first terminal of said device;

an RF source electrically coupled to said second terminal of said device; and an alarm circuit electrically coupled to said third terminal of said device;

whereby, when said RF source transmits an RF signal to said first terminal of said device, said RF signal is passed to said RF load through said second terminal of said device, a portion of said RF signal reflects from said RF load to said alarm circuit through said third terminal of said device, wherein said RF source is an RF transmitter, and wherein said RF load is an antenna which transmits the forward RF signals over the air.

8. The apparatus of claim 7 wherein said alarm circuit is operable to trigger an alarm when said reflected portion of said RF signal meets a particular criterion.

9. The apparatus of claim 7 wherein said RF transmitter has an output circuit electrically coupled to said first terminal of said device, and wherein said antenna has an input terminal electrically coupled to said second terminal of said device.

10. The apparatus of claim 9 wherein said alarm circuit comprises a power detector electrically coupled to said third terminal of said device; an amplifier electrically coupled to said power detector; and an alarm drive circuit electrically coupled to said amplifier.

11. The apparatus of claim 10 wherein said device is a circulator.

12. The apparatus of claim 10 wherein said device is a coupler.

13. The apparatus of claim 7 wherein said particular criterion is met when a detected portion of said reflected portion of said RF signal has a magnitude greater than a predetermined value which indicates that the RF load is damaged, disabled and/or disconnected from said RF source.

14. An apparatus for use in a communications system wherein an RF source sends forward RF signals to an RF load, the apparatus comprising:

an alarm circuit for triggering an alarm when forward RF signals reflected from the RF load meet a particular criterion; and a device for passing said reflected RF signals from the RF load to said alarm circuit, wherein forward RF signals are reflected based upon an impedance mismatch.

15. The apparatus of claim 14, wherein the impedance mismatch is a mismatch between the impedance of the RF load and the RF source.

16. An apparatus comprising:

a device having a first terminal, a second terminal, and a third terminal;

an RF load electrically coupled to said first terminal of said device;

an RF source electrically coupled to said second terminal of said device; and an alarm circuit electrically coupled to said third terminal of said device;

wherein, when said RF source transmits an RF signal to said first terminal of said device, said RF signal is passed to said RF load through said second terminal of said device, a portion of said RF signal reflects from said RF load to said alarm circuit through said third terminal of said device, and wherein the portion of the RF signal reflects based upon an impedance mismatch.

17. The apparatus of claim 16, wherein the impedance mismatch is a mismatch between the impedance of the RF load and the RF source.

* * * * *